United States Patent
Park et al.

(10) Patent No.: US 7,989,257 B2
(45) Date of Patent: Aug. 2, 2011

(54) POLYSILAZANE, METHOD OF SYNTHESIZING POLYSILAZANE, COMPOSITION FOR MANUFACTURING SEMICONDUCTOR DEVICE, AND METHOD OF MANUFACTURING SEMICONDUCTOR DEVICE USING THE COMPOSITION

(75) Inventors: Joo Hyeon Park, Cheonan-si (KR); Yong Chang, Asan-si (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 97 days.

(21) Appl. No.: 12/415,309

(22) Filed: Mar. 31, 2009

(65) Prior Publication Data
US 2010/0112749 A1    May 6, 2010

(30) Foreign Application Priority Data
Nov. 5, 2008   (KR) .................. 10-2008-0109287

(51) Int. Cl.
*H01L 51/40* (2006.01)

(52) U.S. Cl. .................. 438/99; 257/E51.024
(58) Field of Classification Search .......... 438/99, 438/692; 528/31; 257/E51.024
See application file for complete search history.

(56) References Cited

U.S. PATENT DOCUMENTS
2008/0234163 A1*   9/2008   Shimizu et al. .......... 510/175

OTHER PUBLICATIONS

John P. Dismukes, Chemical Synthesis of Microporous Nonoxides Cermaics from Polysilazanes, Chemical Material vol. 9, 1997 pp. 699-706.*

* cited by examiner

*Primary Examiner* — Walter L Lindsay, Jr.
(74) *Attorney, Agent, or Firm* — Ladas & Parry LLP

(57) ABSTRACT

Disclosed are polysilazane, a method of synthesizing the polysilazane, a composition for manufacturing a semiconductor device, and a method of manufacturing a semiconductor device using the composition. The polysilazane is synthesized through a reaction, under a catalyst, between dichlorosilane, trichlorosilane, and ammonia added in a reaction solvent as a reactant. In this instance, a polystyrene conversion weight average molecular weight of the polysilazane is about 2,000 to 30,000.

20 Claims, 2 Drawing Sheets

POLYSILAZANE, METHOD OF SYNTHESIZING POLYSILAZANE, COMPOSITION FOR MANUFACTURING SEMICONDUCTOR DEVICE, AND METHOD OF MANUFACTURING SEMICONDUCTOR DEVICE USING THE COMPOSITION

CROSS-REFERENCE TO RELATED APPLICATION

This application claims the benefit of Korean Patent Application No. 10-2008-0109287, filed on Nov. 5, 2008, in the Korean Intellectual Property Office, the disclosure of which is incorporated herein by reference.

BACKGROUND OF THE INVENTION

1. Field of the Invention

The present invention relates to polysilazane, a method of synthesizing the polysilazane, a composition for manufacturing a semiconductor device, and a method of manufacturing a semiconductor device using the composition.

2. Description of Related Art

In general, a semiconductor device may include patterns formed on a silicon wafer, for example, patterns such as a transistor, a bit line, a capacitor, a metal line, and the like. Because these patterns may be conductive, an insulating layer may be formed between these patterns. A process for forming the insulating layer may include a Premetal Dielectric (PMD) process for insulating between the transistor and bit line, between the bit line and capacitor, and between the capacitor and metal line, an Interlayer Dielectric (ILD) process for insulating between metal lines, and a Shallow Trench Isolation (STI) process for filling a groove such as a trench. The STI process will be hereunder described in detail.

As an interval between these patterns becomes narrow due to high-integration of the semiconductor device, a width of the trench accordingly becomes narrow. Currently, the trench having a width of about 60 nm or less may be required according to a design rule. In this case, problems may be created on a process for manufacturing the semiconductor device. For example, in a process for manufacturing a semiconductor device including a trench having a width of about 60 nm or more according to the design rule, a silicon oxide layer may be formed inside the trench using a Chemical Vapor Deposition (CVD) method. However, in a process for manufacturing the semiconductor device including the trench having a width of about 60 nm or less according to the design rule, pores may be disadvantageously formed inside the trench when using the CVD method for the purpose of forming the silicon oxide layer inside the trench.

In order to overcome the above-mentioned problem, techniques that may generate the silicon oxide layer using a composition for manufacturing the semiconductor device, and enable spin coating have been developed. A composition for manufacturing the semiconductor device including polysilazane may be most gaining attention as the composition for manufacturing the semiconductor device, and accordingly a study for the composition including polysilazane has been actively made. Most of the polysilazane included in the composition for manufacturing the semiconductor device may be synthesized through a reaction between ammonia and dichlorosilane within a reaction solvent. However, the polysilazane obtained through the above-mentioned reaction may have disadvantages that a molecular weight of the polysilazane is extraordinarily small or a yield of the polysilazane is low. When the molecular weight of the polysilazane is extraordinarily small, a film thickness may be disadvantageously formed as being extraordinarily thin in a spin coating process using the composition including the polysilazane, or coating loss in a heating process may be great.

Accordingly, a composition for manufacturing the semiconductor device including polysilazane whose molecular weight is larger may be needed. However, when the molecular weight of the polysilazane is extraordinarily great, a trench filling property by which the polysilazane is filled in the trench may be deteriorated, and which may result in generation of pores inside the trench.

SUMMARY OF THE INVENTION

An aspect of the present invention provides polysilazane excellent in a groove-filling property while having a relatively high molecular weight, a method of synthesizing the polysilazane, a composition for manufacturing a semiconductor device including the polysilazane, and a method of manufacturing a semiconductor device using the composition.

An aspect of the present invention provides polysilazane excellent in coating uniformity, a method of synthesizing the polysilazane, a composition for manufacturing a semiconductor device including the polysilazane, and a method of manufacturing a semiconductor device using the composition.

An aspect of the present invention provides polysilazane capable of minimizing a contraction when heating, a method of synthesizing the polysilazane, a composition for manufacturing a semiconductor device including the polysilazane, and a method of manufacturing a semiconductor device using the composition.

An aspect of the present invention provides polysilazane excellent in etching resistance, a method of synthesizing the polysilazane, a composition for manufacturing a semiconductor device including the polysilazane, and a method of manufacturing a semiconductor device using the composition.

According to an aspect of the present invention, there is provided a polysilazane in which a polystyrene conversion weight average molecular weight is about 2,000 to 30,000, the polysilazane being represented as

[Chemical formula 1]

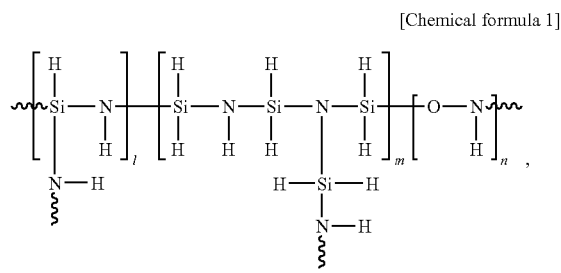

wherein l represents a real number of about 0.01 to 0.2, m represents a real number of about 0.6 to 0.99, and n represents a real number of about 0 to 0.20. In this instance, polysilazane may display any one of a chain type, a cyclic type, and a combination thereof.

According to an aspect of the present invention, there is provided a method of synthesizing polysilazane in which a polystyrene conversion weight average molecular weight is about 2,000 to 30,000, the polysilazane being synthesized through a reaction, under a catalyst, between dichlorosilane, trichlorosilane, and ammonia added in a reaction solvent as a reactant, and the polysilazane being represented as the above Chemical formula 1.

According to an aspect of the present invention, there is provided a composition for manufacturing a semiconductor device, the composition including: about 5 wt % to 30 wt % of polysilazane in which a polystyrene conversion weight average molecular weight is about 2,000 to 30,000, the polysilazane being represented as the above Chemical formula 1; and about 70 wt % to 95 wt % of an organic solvent.

According to an aspect of the present invention, there is provided a method of manufacturing a semiconductor device, the method including: preparing a substrate on which at least one groove is formed; coating on the substrate with a composition for manufacturing a semiconductor device, the composition including about 5 wt % to 30 wt % of polysilazane in which a polystyrene conversion weight average molecular weight is about 2,000 to 30,000, the polysilazane being represented as the above Chemical formula 1; heating the substrate with the composition coated thereon to thereby form a polysilazane layer from which a part or all of the organic solvent is eliminated; and heating the substrate with the polysilazane layer formed thereon under an atmosphere including water vapor and oxygen or under an atmosphere including water vapor and an inert gas to thereby convert the polysilazane layer into a silicon oxide layer.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS

Figure 1:
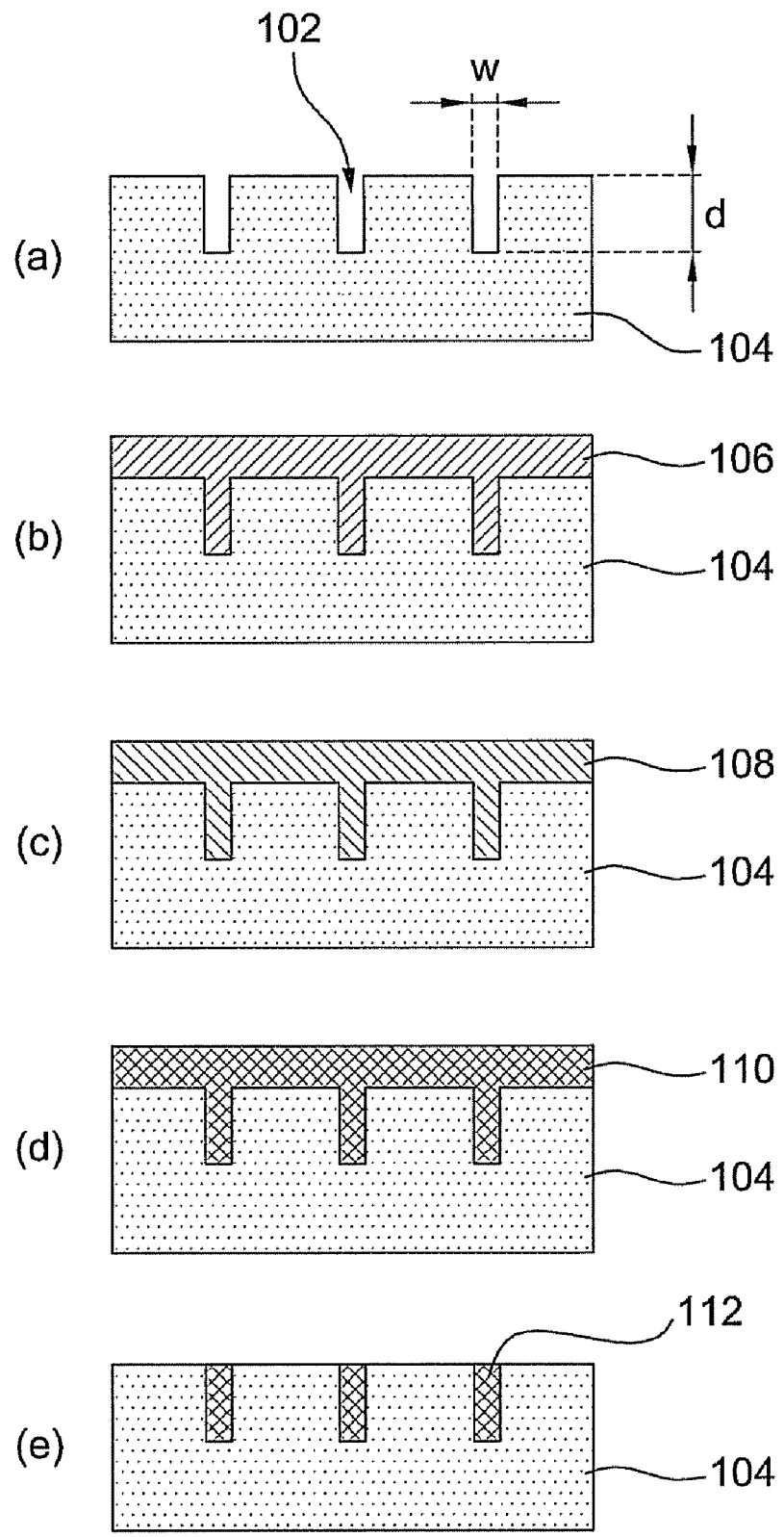
FIGS. 1($a$) through 1($e$) are cross-sectional diagrams illustrating a process for schematically describing a method for manufacturing a semiconductor device according to an exemplary embodiment.

Hereinafter, polysilazane, a method of synthesizing the polysilazane, a composition for manufacturing a semiconductor device, and a method of manufacturing a semiconductor device using the composition according to an exemplary embodiment will be described in detail.

In the polysilazane according to the present exemplary embodiment, a polystyrene conversion weight average molecular weight may be about 2,000 to 30,000, and the polysilazane is represented as

[Chemical formula 1]

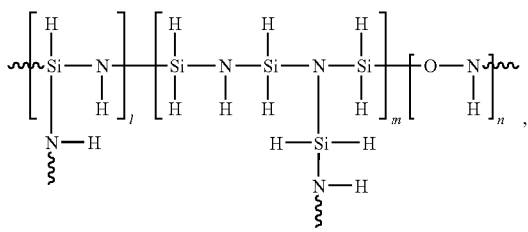

wherein l represents a real number of about 0.01 to 0.2, m represents a real number of about 0.6 to 0.99, and n represents a real number of about 0 to 0.20. In this instance, the polysilazane may be any one of a chain type, a cycle type, and combination of chain and cycle types.

In a spin coating process using the composition for manufacturing the semiconductor device including the polysilazane, when the polystyrene conversion weight average molecular weight of the polysilazane is about 2,000 or less, a film thickness may be formed as being too thin, or coating loss may be large in a case where the polysilazane is converted into a silicon oxide layer through heating. When the polystyrene conversion weight average molecular weight of the polysilazane exceeds about 30,000, a groove-filling property by which the polysilazane and the silicon oxide layer are filled in a groove of the semiconductor device may be deteriorated, and the spin coating process may be difficult to be performed due to a significant high viscosity of the composition for manufacturing the semiconductor device.

The polysilazane is abbreviated as Chemical formula 1 above, however, may have a substantially complex structure, that is, an extraordinarily complex intramolecular bond or intermolecular bond. Also, a part or all of the polysilazane represented as Chemical formula 1 above may be formed in a chain type, a cycle type, or a combination of the chain and cycle types according to a synthesis reaction.

The polysilazane may be synthesized through a reaction, under a catalyst, between dichlorosilane, trichlorosilane, and ammonia added in a reaction solvent as a reactant. In this instance, hydroxylamine may be further added as the reactant.

Hereinafter, a method of synthesizing the polysilazane will be described in detail.

First, when dichlorosilane, trichlorosilane, and catalyst are added in a reaction solvent, a complex of the dichlorosilane and catalyst and a complex of the trichlorosilane and catalyst may be formed.

Here, the reaction solvent is not particularly limited, however, hydrocarbons, ethers, amides, amines, esters, and sulfoxide may be used alone or any combination thereof as the reaction solvent.

Aliphatic hydrocarbons, alicyclic hydrocarbons, aromatic hydrocarbons, and the like may be used alone or any combination thereof as the reaction solvent of the hydrocarbons. The aliphatic hydrocarbons are not particularly limited, however, heptane, octane, nonene, decane, undecane, dodecane, tetradecane, 2,2-dimethylpentane, 2,3-dimethylpentane, 2,4-dimethylpentane, 3,3-dimethylpentane, 2,2,4-trimethylpentane, 2,3,4-trimethylpentane, 2,2-dimethylhexane, 2,4-dimethylhexane, 2,5-dimethylhexane, 3,4-dimethylhexane, 2-methylheptane, 4-methylheptane, ethylcyclohexane, isopropylcyclohexane, 1,4-dimethylcyclohexane, and 1,2,4-trimethylcyclohexane may be used alone or any combination thereof as the aliphatic hydrocarbons. The alicyclic hydrocarbons are not particularly limited, however, cyclohexanone, and methyl cyclohexanol may be used alone or a combination thereof as the alicyclic hydrocarbons. The aromatic hydrocarbons are not particularly limited, however, benzene, toluene, xylene, ethylbenzene, styrene, vinyl toluene, a divinylbenzene may be used alone or any combination thereof as the aromatic hydrocarbons.

The reaction solvent of the ethers is not particularly limited, however, dioxane, dibutyl ether, ethylene glycol dimethyl ether, and ethylene glycol diethyl ether may be used alone or any combination thereof as the reaction solvent of the ethers.

The reaction solvent of the amides is not particularly limited, however, dimethyl acetamide, dimethyl formamide, and N-methylpyrrolidone may be used alone or any combination thereof as the reaction solvent of the amides.

The reaction solvent of the amines is not particularly limited, however, monoethanolamine, diethanolamine, triethanolamine, and pyridine may be used alone or any combination thereof as the reaction solvent of the amines. Heteroamines may be also used for the reaction solvent of the amines.

A molar ratio of trichlorosilane to dichlorosilane may be about 0.02:1 to about 0.2:1. The trichlorosilane may activate cross-linking in a subsequent condensation reaction, thereby slightly increasing a molecular weight of the polysilazane. When the molar ratio of the trichlorosilane to the dichlorosilane is less than about 0.02:1, effects of activating the cross-linking may be disadvantageously insignificant. When the molar ratio of the trichlorosilane to the dichlorosilane exceeds about 0.2:1, the cross-linking may be extraordinarily activated at the time of the condensation reaction, and accordingly the molecular weight of the polysilazane may be extraordinarily increased, whereby the polysilazane may be not well dissolved in an organic solvent.

The catalyst added in the reaction solvent is not particularly limited, however, tertiary amines such as pyridine or heteroamines may be used as the catalyst. In this instance, a separate catalyst may be not used when the reaction solvent and the catalyst are the same.

When the complex of the dichlorosilane and catalyst and the complex of the trichlorosilane and catalyst may be formed, an exothermic reaction may excessively occur. In this reason, the exothermic reaction may be generally performed at about 60° C. or less, however, a solid content may increase when a temperature of the reaction is less than about −10° C., and consequently incurring difficulty in stirring. Accordingly, the temperature of the exothermic reaction may be preferably about −10° C. to 60° C.

When the complex of the dichlorosilane and catalyst and the complex of the trichlorosilane and catalyst are formed within the reaction solvent, ammonia is added in the reaction solvent to perform a condensation reaction of the ammonia and complexes. The complexes may work as an obstacle factor in stirring due to their significantly large quantity of solid phase, however, the condensation reaction may be performed to generate a relatively less quantity of solid from the complexes when the ammonia is added in the reaction solvent, whereby the condensation reaction may be gradually advanced in a relatively better condition for stirring. Since the condensation reaction is a reaction for infusing the ammonia into the reaction solvent, the condensation reaction may be preferably performed at a relatively low temperature, for example, at about −20° C. to 10° C.

Hydroxylamine may be further added in the reaction solvent when the condensation reaction is terminated. This is because, due to a reaction between terminal ends of the polysilazane after the condensation reaction is terminated, a molecular weight of the polysilazane may increase, or a part or all of the polysilazane may be formed into a ring shape, whereby a minimum amount of a primary amine group is required to be present in the polysilazane. Specifically, the polysilazane may be easily gelled contacting the air due to instability of the polysilazane when a relatively large amount of the primary amine group is present in the polysilazane. In order to prevent this, the terminal ends of the polysilazane is required to be protected using a more stable compound than the primary amine group, and hydroxylamine may be introduced as the more stable compound.

In a conventional art, alcohol or a carboxylic acid may be used in order to remove the primary amine group of the polysilazane. In this case, carbon atoms may remain in the silicon oxide layer during a heating process after a spin coating is performed with respect to the composition for manufacturing the semiconductor device, and the carbon atoms may disadvantageously work as impurities in the semiconductor manufacturing process. However, according to the present exemplary embodiment, the hydroxylamine may not include the carbon atoms at all, and thereby the above-mentioned problem may not occur when the terminal ends of the polysilazane is protected using the hydroxylamine.

In general, a combination between silicon atoms and oxygen atoms is relatively strong, however, a combination between the silicon atoms and nitrogen atoms is remarkably weak. Accordingly, when the hydroxylamine is added in the reaction solvent after the condensation reaction is terminated, a hydroxyl group of the hydroxylamine may be initially reacted with the silicon atoms to form stable polysilazane. An example in which the hydroxylamine is introduced to protect the distal ends of the polysilazane is hereinbefore described in detail, however, another example in which a compound not including the carbon atoms is introduced to protect the same may be also possible.

An ammonium salt generated in the reaction is removed through a filter when the reaction performed using the added hydroxylamine is terminated, and then the reaction solvent is removed in a vacuum condition, thereby obtaining the polysilazane. A temperature when removing the reaction solvent may be preferably about 50° C. or less, so that the process is carried out under a reduced pressure.

Hereinafter, the composition for manufacturing the semiconductor device including the polysilazane will be described in detail.

The composition according to the present exemplary embodiment may include about 5 wt % to 30 wt % of polysilazane in which a polystyrene conversion weight average molecular weight is about 2,000 to 30,000, the polysilazane being represented as Equation 1 below, and about 70 wt % to 95 wt % of an organic solvent. Also, the composition according to the present exemplary embodiment may further include other additives. Here, the polysilazane may the same as the above, and thus repeated description thereof will be omitted, and only characteristics of the polysilazane will be hereinafter described in detail.

[Chemical formula 1]

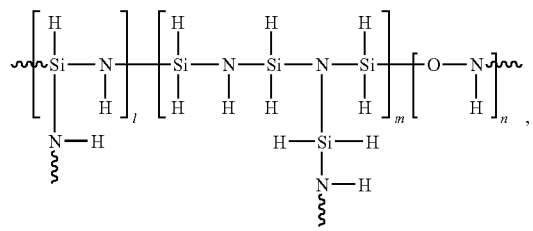

wherein l represents a real number of about 0.01 to 0.2, m represents a real number of about 0.6 to 0.99, and n represents a real number of about 0 to 0.20, and the polysilazane may display any one of a chain type, a cyclic type, and a combination thereof.

When the polysilazane is about 5 wt % or less based on a total amount of the composition, a viscosity of the composition is deteriorated, whereby a film thickness obtained after performing the spin coating is extraordinarily thin. Also, when the polysilazane is about 30 wt % or more based on the total amount of the composition, the viscosity of the composition is unnecessarily increased, whereby the film thickness obtained after performing the spin coating is extraordinarily thick.

The organic solvent may be provided as being a composition type obtained by melting the polysilazane, which is not be particularly limited, however, toluene, xylene, ethylbenzene, diethylbenzene, heptane, dibutyl ether, ethylene glycol dimethyl ether, ethylene glycol diethyl ether, cyclohexanone, methyl isobutyl ketone, 2-heptanone, propylene glycol monomethyl ether acetate, and butyl acetate may be used alone or any combination thereof as the organic solvent. Since solid particles may remain in the organic solvent even though the polysilazane is melted in the organic solvent, the solid particles may be removed using a predetermined filter, for example, a filter of about 0.1 µm after melting the polysilazane in the organic solvent.

The additive is not particularly limited, however, a surfactant used for improving a coating property of the composition including the polysilazane, and an amine additive used for preventing the polysilazane from being lost during a process for converting the polysilazane into a silicon oxide may be used alone or a combination thereof as the additive.

The surfactant, that is, a non-metallic material compound is not particularly limited, however polyethers, quaternary ammonium salt, and perfluoro sulfonate may be used alone or any combination thereof as the surfactant. A used amount of the surfactant may be preferably about 50 ppm to 500 ppm based on the total amount of the composition. Any one of tertiary amines may be used as the amine additive, however, diazabicycloun-decene (DBU), tetraethylethylenediamine (TEDA), and tetramethylguanidine (TMG), which have low volatility and high basicity, an amine compound with six or more carbon atoms, and a hetero-amine compound may be used alone or any combination thereof. A used amount of the amines may be preferably within a range of about 0.5 wt % to 5 wt % based on the total amount of the composition. When the used amount of the amines is not within the range, the amines may not have any effects, and work as impurities on the silicon oxide layer.

Hereinafter, a method for manufacturing the semiconductor device using the composition for manufacturing the semiconductor device will be described in detail.

The method according to an exemplary embodiment may include preparing a substrate on which at least one groove is formed, coating on the substrate with a composition for manufacturing a semiconductor device, heating the substrate with the composition coated thereon to thereby form a polysilazane layer from which a part or all of the organic solvent is eliminated, and heating the substrate with the polysilazane layer formed thereon under an atmosphere including water vapor and oxygen or under an atmosphere including water vapor and an inert gas to thereby convert the polysilazane layer into a silicon oxide layer. In this instance, the composition may include about 5 wt % to 30 wt % of polysilazane in which a polystyrene conversion weight average molecular weight is about 2,000 to 30,000, the polysilazane being represented as chemical formula 1 below, and about 70 wt % to 95 wt % of an organic solvent. Also, the method according to an exemplary embodiment may further include performing a chemical mechanical polishing (CMP) on a part of the silicon oxide layer. Also, the method according to an exemplary embodiment may further include washing a substrate on which the part of the silicon oxide layer is chemically and mechanically polished, and drying the washed substrate.

Here, the composition for manufacturing the semiconductor device may be the same as the above, and thus repeated descriptions thereof will be omitted, and only characteristics will be described in detail.

[Chemical formula 1]

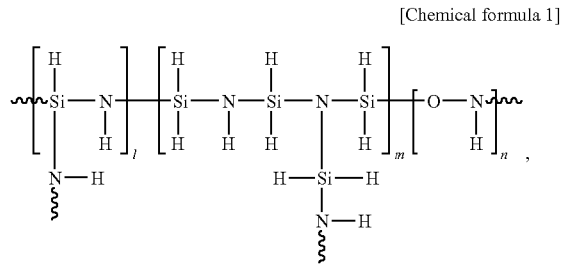

wherein 1 represents a real number of about 0.01 to 0.2, m represents a real number of about 0.6 to 0.99, and n represents a real number of about 0 to 0.20, and the polysilazane may display any one of a chain type, a cyclic type, and a combination thereof.

Hereinafter, the method for manufacturing the semiconductor device will be described in detail with reference to FIG. 1.

FIG. 1(a) through 1(e) are cross-sectional diagram illustrating a process for schematically describing the method for manufacturing the semiconductor device according to an exemplary embodiment.

Referring to (a) of FIG. 1, a substrate 104 on which at least one groove 102 is formed may be prepared. An example in which the at least one groove 102 is a trench is herein described, however, the present invention is limited thereto. For example, the present invention may be applicable in a Shallow Trench Isolation (STI) process, a Premetal Dielectric (PMD) process, an Interlayer Dielectric (ILD) process, and the like. Here, the substrate 104 may be a silicon wafer, however the present invention is not limited thereto. The substrate 104 may include various patterns (not shown), the insulating layer (not shown), and the like formed thereon.

A width (w) of the at least one groove 102 may be less than about 200 nm, an aspect ratio of a depth (d) of the at least one groove 102 to the width (w) may be more than about 2. The groove 102 may be formed through photo or photolithography process. A shape of the at least one groove 102 may be particularly limited, however, a rectangular shape, a forward taper shape, a backward taper shape, and a curved surface shape may be preferable.

Next, as shown (b) in FIG. 1, a composition 106 for the semiconductor device may be coated on the substrate 104 so that the at least one groove is filled with the composition 106. As the coating method, spin coating, dipping, spraying, photolithography, and the like may be selectively used.

Next, as shown (c) in FIG. 1, the substrate 104 with the composition coated thereon may be heated to about 100° C. to 250° C. to thereby remove a part or all of the solvent. In this manner, a polysilazane layer 108 may be filled in the at least one groove. The heating process may be performed for about 60 minutes or more, however, the temperature and time of the process may vary according to the film thickness at the time of coating and an amount and type of the solvent, and thus the present invention is not limited thereto. Also, the polysilazane layer 108 may be slightly hardened depending on the temperature and time. In addition, the temperature may be elevated in a stepwise manner in order to minimize formation of pores inside the trench when removing the solvent. The pores may be formed or minimized depending on the temperature elevated in the stepwise manner. For example, rapid temperature elevation may promote hardening of the polysilazane layer 108 formed on the substrate 104, whereby the trench is not completely filled with the polysilazane layer 108. In this case, the temperature is required to be gradually elevated in the stepwise manner, so that the polysilazane layer 108 is filled in the trench.

Next, as shown in (d) of FIG. 1, the substrate 104 with the polysilazane layer 108 formed thereon may be heated to about 300° C. to 1,200° C. under an atmosphere including water vapor and oxygen or under an atmosphere including water vapor and an inert gas. As a result, the polysilazane layer 108 may be converted into a silicon oxide layer 110. The heating temperature may be maintained for about 30 minutes or more. Here, each concentration of the water vapor and oxygen and each concentration of the water vapor and the inert gas may vary according to a thickness of the polysilazane layer 108 and a type of the semiconductor device, and the present invention is not limited thereto.

The polysilazane layer 108 may undergo a hydrolysis reaction using the water vapor through the above-mentioned heating process. Specifically, a part or all of Si—N bond of the polysilazane layer 108 through the heating process may be changed into Si—O bond, whereby the polysilazane layer 108 is converted into the silicon oxide layer 110. Advantageously, since this converting process may not be accompanied with a condensation reaction, a change in the volume before and after the converting process may be remarkably small. In this reason, when the semiconductor device is manufactured using the composition for manufacturing the semiconductor device according to the present exemplary embodiment, the semiconductor device without the pores formed inside the trench may be obtained.

Next, as shown in (e) of FIG. 1, the CMP may be performed on a part of the silicon oxide layer 112 formed on the substrate 104, as necessary. As a result, the silicon oxide layer 112 may be filled only in the at least one groove 102, and the silicon oxide layer 112 may be a patterned type. In the CMP, slurry for the CMP including at least one from silica, alumina, ceria, and the like may be used as CMP particles according to a type of an object on which the CMP is performed.

Next, the substrate 104 may be washed, as necessary. This washing may be a process for removing foreign substances attached or/and stuck on the substrate 104, however, the present invention is not limited thereto. For example, the washing may include a process for slightly etching the substrate 104 using acid solution, for example, hydrofluoric acid (HF) solution so as to improve the washing effects. When the silicon oxide layer converted from the polysilazane layer 108 may have low mechanical strength or low etching resistance with respect to the acid solution, the CMP or washing may incur many problems. However, in manufacturing the semiconductor device using the composition for manufacturing the semiconductor device according to an exemplary embodiment, the mechanical strength of the silicon oxide layer and the etching resistance with respect to the acid solution may be advantageously high.

Next, the substrate 104 may be dried. This drying may be performed using various techniques such as air knife technique, heating technique, and the like, which are well known in the art.

As described above, the polysilazane according to an exemplary embodiment may have a high molecular weight. In manufacturing the semiconductor device using the composition for manufacturing the semiconductor device according to an exemplary embodiment, coating uniformity of the composition may be improved. Also, in manufacturing the semiconductor device using the composition for manufacturing the semiconductor device according to an exemplary embodiment, the polysilazane and the silicon oxide layer converted from the polysilazane layer may be excellent in a groove-filling property, and may be minimized in their contractions. Also, a wet-etching resistance may be improved.

Hereinafter, the present invention will be described in detail by synthesis examples and examples. It is to be understood, however, that these examples are for illustrative purpose only, and are not construed to limit the scope of the present invention.

SYNTHESIS EXAMPLES

1. Polysilazane Synthesis

Synthesis Example 1

Figure 2:
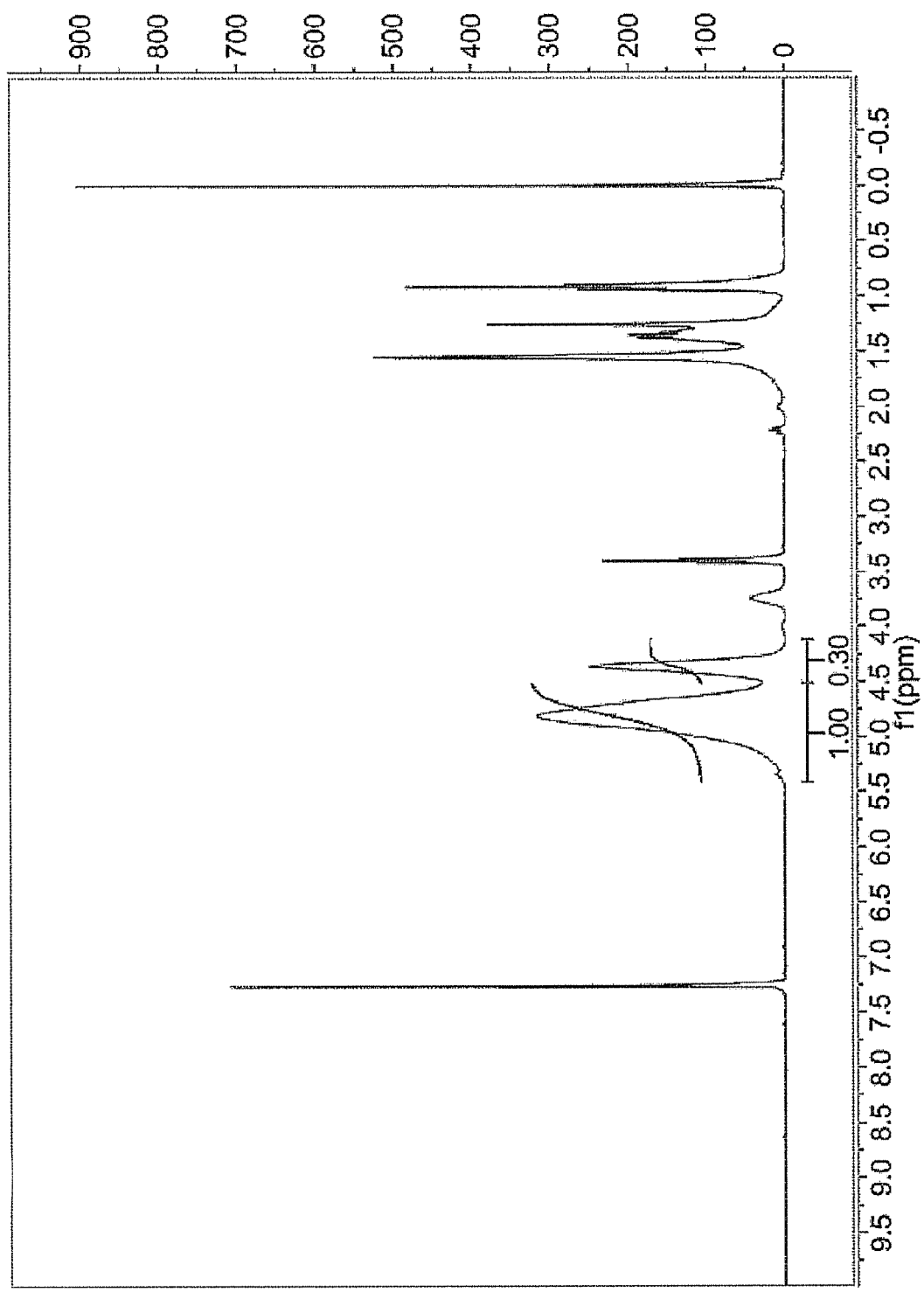
FIG. 2 is a diagram illustrating of a $^1$H-NMR spectrum of polysilazane A obtained by synthesis example 1.

About 500 g of dried pyridine was inserted in a flask, cooled to 0° C. or less, and then about 35 g of dichlorosilane and about 4.7 g of trichlorosilane were gradually added in the flask. Subsequently, about 10 g of ammonia was gradually added in the flask, and stirred at an identical temperature about for one hour. Next, about 1.1 g of hydroxylamine was added in the flask, stirred at room temperature for about two hours, and then a residual of the ammonia was removed using a nitrogen gas. Next, an ammonium salt existing in a reaction mixture from which the ammonia is removed was removed using a filter. Next, the pyridine was completely removed from a remainder in a vacuum condition, thereby obtaining about 12.8 g of polysilazane A (see Reaction formula 1 below). A polystyrene conversion weight average molecular weight of the obtained polysilazane A was about 3,200. An $^1$H-NMR spectrum of the polysilazane A is shown in FIG. 2. Here, the polysilazane A was diluted with a small quantity of dibutyl ether, and the polysilazane A was dissolved in CDCl$_3$, and the $^1$H-NMR spectrum of the polysilazane A was measured.

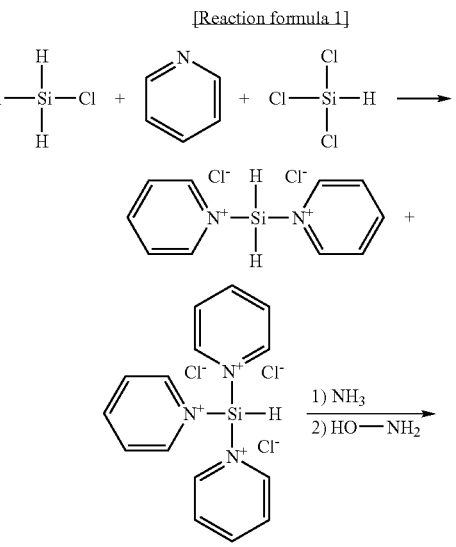

[Reaction formula 1]

-continued

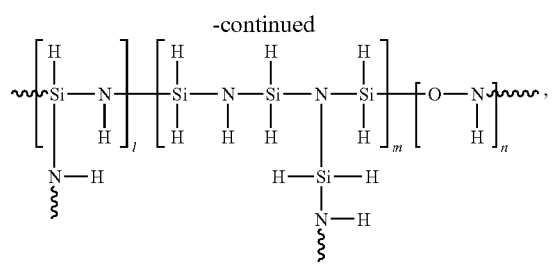

wherein 1 represents a real number of about 0.01 to 0.2, m represents a real number of about 0.6 to 0.99, and n represents a real number of about 0 to 0.20, and the polysilazane may display any one of a chain type, a cyclic type, and a combination thereof.

Synthesis Example 2

About 14.6 g of polysilazane B was obtained through the same process as that of the above Synthesis example 1, excepting that the pyridine was heated to about 100° C. at an atmospheric pressure, and thus removed from the remainder. A polystyrene conversion weight average molecular weight of the obtained polysilazane B was about 25,000.

Synthesis Example 3

About 13.6 g of polysilazane C was obtained through the same process as that of the above Synthesis example 1, excepting that about 2.4 g of the trichlorosilane was used instead of about 4.7 g of the trichlorosilane. A polystyrene conversion weight average molecular weight of the obtained polysilazane C was about 6,000.

Synthesis Example 4

About 14 g of polysilazane D was obtained through the same process as that of the above Synthesis example 1, except that about 0.6 g of the hydroxylamine was used instead of about 1.1 g of the hydroxylamine. A polystyrene conversion weight average molecular weight of the obtained polysilazane D was about 4,800.

Synthesis Example 5

About 12 g of polysilazane E was obtained through the same process as that of the above Synthesis example 1, except that the hydroxylamine was not used. A polystyrene conversion weight average molecular weight of the obtained polysilazane E was about 8,000.

Synthesis Comparative Example 1

About 4.5 g of polysilazane F was obtained through the same process as that of the above Synthesis example 1, except that the ammonia was added without using the trichlorosilane and hydroxylamine, and stirred at room temperature for about two hours. A polystyrene conversion weight average molecular weight of the obtained polysilazane F was about 1,000.

Synthesis Comparative Example 2

About 5 g of polysilazane G was obtained through the same process as that of the above Synthesis example 1, except that the pyridine was heated to about 100° C. at an atmospheric pressure, and thus removed from the balance. A polystyrene conversion weight average molecular weight of the obtained polysilazane G was about 2,200.

EXAMPLES

1. Manufacturing Composition for Manufacturing Semiconductor Device

Example 1

The polysilazane A obtained through the above Synthesis example 1 was dissolved in dibutyl ether so that an amount of the polysilazane A was about 15 wt % based on a total amount of the composition, and then particles were removed from a solution using a filter of about 0.1 μm, thereby manufacturing the composition for manufacturing the semiconductor device.

Example 2

The composition for manufacturing the semiconductor device was fabricated through the same process as that of Example 1, except that the polysilazane B obtained through Synthesis example 2 was used instead of the polysilazane A.

Example 3

The composition for manufacturing the semiconductor device was fabricated through the same process as that of Example 1, except that the polysilazane C obtained through Synthesis example 3 was used instead of the polysilazane A.

Example 4

The composition for manufacturing the semiconductor device was fabricated through the same process as that of Example 1, except that the polysilazane D obtained through Synthesis example 4 was used instead of the polysilazane A.

Example 5

The composition for manufacturing the semiconductor device was fabricated through the same process as that of Example 1, except that the polysilazane E obtained through Synthesis example 5 was used instead of the polysilazane A.

Comparative Example 1

The composition for manufacturing the semiconductor device was fabricated through the same process as that of Example 1, except that the polysilazane F obtained through Synthesis comparative example 1 was used instead of the polysilazane A.

Comparative Example 2

The composition for manufacturing the semiconductor device was fabricated through the same process as that of Example 1, except that the polysilazane G obtained through Synthesis comparative example 2 was used instead of the polysilazane A.

2. Manufacturing Semiconductor Device

Example 6

About 5 ml of the composition fabricated through Example 1 was dropped on a silicon wafer on which a trench having a width of about 45 nm and a depth of about 100 nm was formed, and a coated film was formed using a spin coating method. Next, the coated film was heated at about 150° C. for about two minutes, thereby removing dibutyl ether of an organic solvent, and forming a polysilazane layer filled in the trench. Next, the silicon wafer was heated to about 800° C. in a stepwise manner, and heated for about 30 minutes, thereby converting the polysilazane layer into a silicon oxide layer. Next, a chemical mechanical polishing (CMP) was performed on the silicon oxide layer using ceria slurry. Next, the silicon wafer was immersed in an HF solution of about 1 wt % for about one minute, and then the substrate was dried, thereby manufacturing the semiconductor device.

Example 7

The semiconductor device was manufactured through the same process as that of Example 6, except that the composition fabricated through Example 2 was used instead of the composition fabricated through Example 1.

Example 8

The semiconductor device was manufactured through the same process as that of Example 6, except that the composition fabricated through Example 3 was used instead of the composition fabricated through Example 1.

Example 9

The semiconductor device was manufactured through the same process as that of Example 6, except that the composition fabricated through Example 4 was used instead of the composition fabricated through Example 1.

Example 10

The semiconductor device was manufactured through the same process as that of Example 6, except that the composition fabricated through Example 5 was used instead of the composition fabricated through Example 1.

Comparative Example 3

The semiconductor device was manufactured through the same process as that of Example 6, except that the composition fabricated through Comparative example 1 was used instead of the composition fabricated through Example 1.

Comparative Example 4

The semiconductor device was manufactured through the same process as that of Example 6, except that the composition fabricated through Comparative example 2 was used instead of the composition fabricated through Example 1.

3. Estimation of Characteristics of Composition for Manufacturing Semiconductor Device Coating uniformity, an etch ratio, presence/absence of pores formed inside the trench, and presence/absence of gel formation with respect to each composition for manufacturing the semiconductor device of Examples 1 to 5 and Comparative examples 1 and 2 were observed and measured when each semiconductor devices of Examples 6 to 10 and Comparative examples 3 and 4 was manufactured, and the results are shown in Table 1. The coating uniformity, etch ratio, presence/absence of pores formed inside the trench were observed via an electron microscope by cutting the silicon wafer in its cross-sectional area. The presence/absence of gel formation was observed such that the composition was spin coated on the silicon wafer in a clean room whose temperature was about 24±1° C. and whose relative humidity was about 40±3%, and then the composition was left for six days.

TABLE 1

| | type of polysilazane | Coating uniformity | Etch ratio[1] | Presence/absence of pores formed inside trench | Presence/absence of gel formation |
|---|---|---|---|---|---|
| Example 1 | A | Uniform | 1.1 | Absence | Absence |
| Example 2 | B | Uniform | 1.1 | Presence | Absence |
| Example 3 | C | Uniform | 1.1 | Absence | Absence |
| Example 4 | D | Uniform | 1.1 | Absence | Absence |
| Example 5 | E | Uniform | 1.1 | Absence | Absence |
| Comparative example 1 | F | non-uniform | unmeasurable | unmeasurable | Presence |
| Comparative example 2 | G | Uniform | 1.5 | Presence | Presence |

Etch ratio[1]: a ratio of an etching speed inside the trench with respect to an HF solution of about 1 wt % to an etching speed outside the trench with respect to an HF solution of about 1 wt %

As shown in Table 1, the compositions of Examples 1 to 5 were generally excellent in the coating uniformity, etching resistance, trench-filling property, non-formation of solid content in comparison with the compositions of Comparative examples 1 and 2.

As described above, according to the present invention, the polysilazane may have a relatively high molecular weight. When the semiconductor device is manufactured using the composition for manufacturing the semiconductor device according to the present invention, coating uniformity of the composition may be improved. Also, when the semiconductor device is manufactured using the composition for manufacturing the semiconductor device according to the present invention, the polysilazane and the silicon oxide layer converted from the polysilazane may be excellent in a groove-filling property, a contraction of the polysilazane and silicon oxide layer may be minimized, and wet-etching resistance may be improved.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method of synthesizing polysilazane in which a polystyrene conversion weight average molecular weight is about 2,000 to 30,000, the polysilazane being synthesized through a reaction, under a catalyst, between dichlorosilane, trichlorosilane, and ammonia added in a reaction solvent as a reactant, and the polysilazane being represented as

[Chemical formula 1]

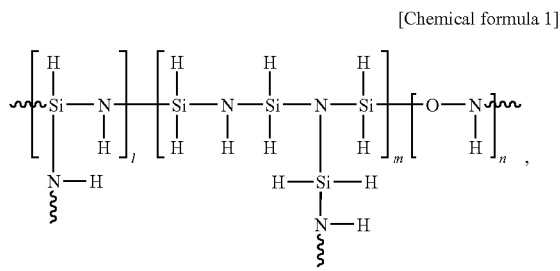

wherein l represents a real number of about 0.01 to 0.2, m represents a real number of about 0.6 to 0.99, and n represents a real number of about 0 to 0.20.

2. The method of claim 1, wherein the reactant further includes hydroxylamine.

3. The method of claim 1, wherein the reaction solvent is one or more selected from a group consisting of hydrocarbons, ethers, amides, amines, esters, and sulfoxide.

4. The method of claim 1, wherein a molar ratio of trichlorosilane to dichlorosilane is about 0.02:1 to about 0.2:1.

5. The method of claim 1, wherein the catalyst is tertiary amines or hetero-amines.

6. The method of claim 1, wherein the reaction solvent and catalyst are tertiary amines or hetero-amines, the reaction solvent and catalyst being the same.

7. A method of manufacturing a semiconductor device, the method comprising:
preparing a substrate on which at least one groove is formed;
coating on the substrate with a composition for manufacturing a semiconductor device, the composition including about 5 wt % to 30 wt % of polysilazane in which a polystyrene conversion weight average molecular weight is about 2,000 to 30,000, the polysilazane being represented as

[Chemical formula 1]

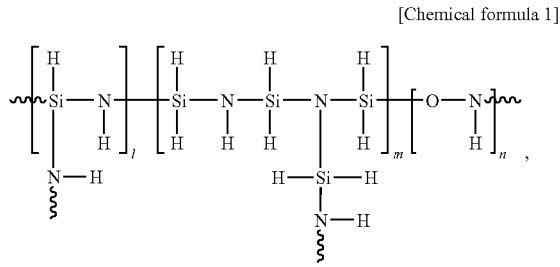

wherein l represents a real number of about 0.01 to 0.2, m represents a real number of about 0.6 to 0.99, and n represents a real number of about 0 to 0.20, and about 70 wt % to 95 wt % of an organic solvent;
heating the substrate with the composition coated thereon to thereby form a polysilazane layer from which a part or all of the organic solvent is eliminated; and
heating the substrate with the polysilazane layer formed thereon under an atmosphere including water vapor and oxygen or under an atmosphere including water vapor and an inert gas to thereby convert the polysilazane layer into a silicon oxide layer.

8. The composition of claim 7, wherein the organic solvent is one or more selected from a group consisting of toluene, xylene, ethylbenzene, diethylbenzene, heptane, dibutyl ether, ethylene glycol dimethyl ether, ethylene glycol diethyl ether, cyclohexanone, methyl isobutyl ketone, 2-heptanone, propylene glycol monomethyl ether acetate, and butyl acetate.

9. The method of claim 7, further comprising:performing a chemical mechanical polishing (CMP) on a part of the silicon oxide layer.

10. The method of claim of claim 9, further comprising:
washing a substrate on which the part of the silicon oxide layer is chemically and mechanically polished; and
drying the washed substrate.

11. The method of claim of claim 7, wherein the at least one groove has a width of about 200 nm or less, and a ratio of a depth of the at least one groove to the width is about 2 or more.

12. The method of claim 7, wherein the heating of the substrate with the composition coated thereon is performed at about 100° C. to about 250° C.

13. The method of claim 7, wherein the heating of the substrate with the polysilazane layer formed thereon is performed at about 300° C. to 1,200° C.

14. The method of claim 2, wherein the reaction solvent is selected from the group consisting of heptane, octane, nonene, decane, undecane, dodecane, tetradecane, 2,2-dimethylpentane, 2,3-dimethylpentane, 2,4-dimethylpentane, 3,3-dimethylpentane, 2,2,4-trimethylpentane, 2,3,4-trimethylpentane, 2,2-dimethylhexane, 2,4-dimethylhexane, 2,5-dimethylhexane, 3,4-dimethylhexane, 2-methylheptane, 4-methylheptane, ethylcyclohexane, isopropylcyclohexane, 1,4-dimethylcyclohexane, 1,2,4-trimethylcyclohexane, cyclohexanone, methyl cyclohexanol, benzene, toluene, xylene, ethylbenzene, styrene, vinyl toluene, a divinylbenzene, dioxane, dibutyl ether, ethylene glycol dimethyl ether, ethylene glycol diethyl ether, dimethyl acetamide, dimethyl formamide, N-methylpyrrolidone, monoethanolamine, diethanolamine, triethanolamine, and pyridine.

15. The method of claim 2, wherein the hydroxylamine is added in the reaction solvent to terminate the reaction by protecting distal ends of the polysilazane to protect the polysilazane from gelling when exposed to air.

16. The method of claim 1, further comprising filtering the reaction solvent subsequent to remove ammonium salts in the reaction solvent.

17. The method of claim 1, further comprising:
removing the reaction solvent from the polysilazane; and
melting the polysilazane in an organic solvent.

18. The method of claim 17 wherein the organic solvent is selected from the group consisting of toluene, xylene, ethylbenzene, diethylbenzene, heptane, dibutyl ether, ethylene glycol dimethyl ether, ethylene glycol diethyl ether, cyclohexanone, methyl isobutyl ketone, 2-heptanone, propylene glycol monomethyl ether acetate, and butyl acetate.

19. The method of claim 17 further comprising:
 adding a surfactant into the organic solvent with the melted polysilazane at about 50 ppm to about 500 ppm; and
 adding an amine additive into the organic with the melted polysilazane within a range of about 0.5 wt % to 5 wt %.

20. The method of claim 19 wherein the surfactant is selected from the group consisting of polyethers, a quanternary ammonium salt, and perfluorosulfonate, wherein the amine additive is selected from the group consisting of tertiary amines, diazabicycloun-decene (DBU), tetraethylethylenediamine (TEDA), tetramethylguanidine (TMG), an amine compound with six or more carbon atoms, and a hetero-amine compound and any combination thereof.

* * * * *